(12) United States Patent
Yang et al.

(10) Patent No.: US 12,080,794 B2
(45) Date of Patent: Sep. 3, 2024

(54) MANUFACTURING METHOD OF HIGH VOLTAGE SEMICONDUCTOR DEVICE

(71) Applicant: UNITED MICROELECTRONICS CORP., Hsin-Chu (TW)

(72) Inventors: Tsung-Yu Yang, Chiayi County (TW); Shin-Hung Li, Nantou County (TW); Nien-Chung Li, Hsinchu (TW); Chang-Po Hsiung, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 54 days.

(21) Appl. No.: 18/139,960

(22) Filed: Apr. 27, 2023

(65) Prior Publication Data

US 2023/0335637 A1   Oct. 19, 2023

Related U.S. Application Data

(62) Division of application No. 17/159,166, filed on Jan. 27, 2021, now Pat. No. 11,682,726.

(30) Foreign Application Priority Data

Dec. 30, 2020   (CN) .......................... 202011601728.1

(51) Int. Cl.
H01L 29/78   (2006.01)
H01L 29/06   (2006.01)
H01L 29/10   (2006.01)
H01L 29/51   (2006.01)
H01L 29/66   (2006.01)

(52) U.S. Cl.
CPC ...... *H01L 29/7824* (2013.01); *H01L 29/0649* (2013.01); *H01L 29/1079* (2013.01); *H01L 29/517* (2013.01); *H01L 29/66689* (2013.01)

(58) Field of Classification Search
CPC ........... H01L 29/42368; H01L 29/7836; H01L 29/0653; H01L 21/2822
See application file for complete search history.

(56) References Cited

U.S. PATENT DOCUMENTS

| 5,972,777 | A | 10/1999 | Hsu |
| 6,229,184 | B1* | 5/2001 | Riccobene ........ H01L 21/28202 438/257 |
| 6,544,853 | B1 | 4/2003 | Lin |
| 6,586,808 | B1 | 7/2003 | Xiang |
| 8,846,510 | B2 | 9/2014 | Chuang |
| 10,141,398 | B1* | 11/2018 | Tsai .................. H01L 29/4916 |
| 11,682,726 | B2 | 6/2023 | Yang |
| 2006/0151843 | A1 | 7/2006 | Yang |

(Continued)

*Primary Examiner* — Raj R Gupta
(74) *Attorney, Agent, or Firm* — Winston Hsu

(57) ABSTRACT

A high voltage semiconductor device includes a semiconductor substrate, an isolation structure, a gate oxide layer, and a gate structure. The semiconductor substrate includes a channel region, and at least a part of the isolation structure is disposed in the semiconductor substrate and surrounds the channel region. The gate oxide layer is disposed on the semiconductor substrate, and the gate oxide layer includes a first portion and a second portion. The second portion is disposed at two opposite sides of the first portion in a horizontal direction, and a thickness of the first portion is greater than a thickness of the second portion. The gate structure is disposed on the gate oxide layer and the isolation structure.

9 Claims, 5 Drawing Sheets

(56) References Cited

U.S. PATENT DOCUMENTS

2009/0032870 A1    2/2009   Iida
2019/0341491 A1*   11/2019   Huang ................ H01L 29/0878
2022/0102518 A1    3/2022   Chen

* cited by examiner

MANUFACTURING METHOD OF HIGH VOLTAGE SEMICONDUCTOR DEVICE

CROSS REFERENCE TO RELATED APPLICATIONS

This application is a division of U.S. application Ser. No. 17/159,166, filed on Jan. 27, 2021. The content of the application is incorporated herein by reference.

BACKGROUND OF THE INVENTION

1. Field of the Invention

The present invention relates to a semiconductor device and a manufacturing method thereof, and more particularly, to a high voltage semiconductor device and a manufacturing method thereof.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency band power amplifier. The essential feature of LDMOS transistor device is a lateral-diffused drift region with low doping concentration and large area. The drift region is used to alleviate the high voltage between the drain and the source, and therefore LDMOS transistor device can have higher breakdown voltage. However, as the requirements of related products become higher and higher, how to improve the electrical performance, the voltage endurance or/and reliability of high voltage semiconductor units through design modifications in the structure or/and process is still a continuous issue for those in the relevant fields.

SUMMARY OF THE INVENTION

A high voltage semiconductor device and a manufacturing method thereof are provided in the present invention. A gate oxide layer including portions with different thicknesses is formed, and the electrical performance of the high voltage semiconductor device may be improved accordingly while the reliability of the high voltage semiconductor device is improved by the relatively thicker portion of the gate oxide layer.

According to an embodiment of the present invention, a high voltage semiconductor device is provided. The high voltage semiconductor device includes a semiconductor substrate, an isolation structure, a gate oxide layer, and a gate structure. The semiconductor substrate includes a channel region. At least a part of the isolation structure is disposed in the semiconductor substrate and surrounds the channel region. The gate oxide layer is disposed on the semiconductor substrate, and the gate oxide layer includes a first portion and a second portion. The second portion is disposed at two opposite sides of the first portion in a horizontal direction, and a thickness of the first portion is greater than a thickness of the second portion. The gate structure is disposed on the gate oxide layer and the isolation structure.

According to an embodiment of the present invention, a manufacturing method of a high voltage semiconductor device is provided. The manufacturing method includes the following steps. A semiconductor substrate is provided. An isolation structure is formed, and at least a part of the isolation structure is formed in the semiconductor substrate and surrounds a channel region in the semiconductor substrate. A gate oxide layer is formed on the semiconductor substrate, and the gate oxide layer includes a first portion and a second portion. The second portion is disposed at two opposite sides of the first portion in a horizontal direction, and a thickness of the first portion is greater than a thickness of the second portion. A gate structure is formed on the gate oxide layer and the isolation structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-6 are schematic drawings illustrating a manufacturing method of a high voltage semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

FIG. 7 and FIG. 8 are schematic drawings illustrating a manufacturing method of a high voltage semiconductor device according to a second embodiment of the present invention, wherein FIG. 8 is a schematic drawing in a step subsequent to FIG. 7.

FIG. 9 and FIG. 10 are schematic drawings illustrating a manufacturing method of a high voltage semiconductor device according to a third embodiment of the present invention, wherein FIG. 10 is a schematic drawing in a step subsequent to FIG. 9.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
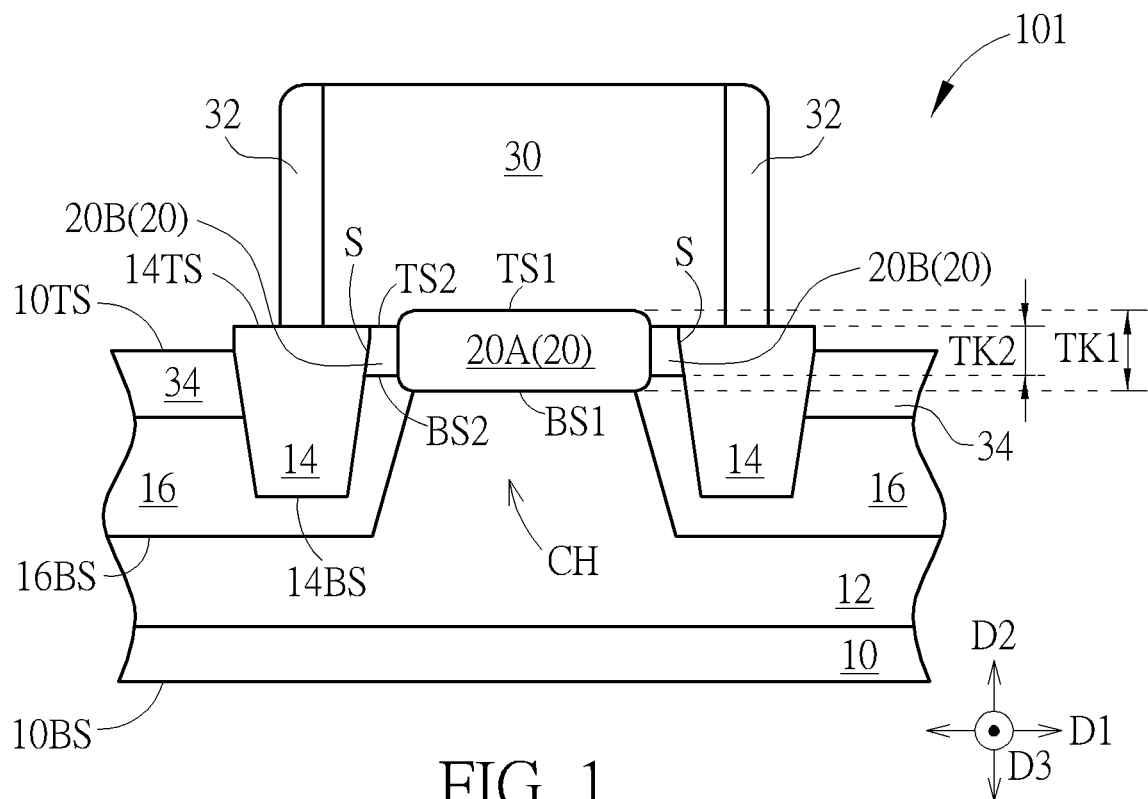
FIG. 1 is a schematic drawing illustrating a high voltage semiconductor device according to a first embodiment of the present invention.

Please refer to FIG. 1. FIG. 1 is a schematic drawing illustrating a high voltage semiconductor device according to a first embodiment of the present invention. As shown in FIG. 1, a high voltage semiconductor device 101 includes a semiconductor substrate 10, an isolation structure 14, a gate oxide layer 20, and a gate structure 30. The semiconductor substrate 10 includes a channel region CH. At least a part of the isolation structure 14 is disposed in the semiconductor substrate 10 and surrounds the channel region CH. The gate oxide layer 20 is disposed on the semiconductor substrate 10, and the gate oxide layer 20 includes a first portion 20A and a second portion 20B. The second portion 20B is disposed at two opposite sides of the first portion 20A in a horizontal direction (such as a first direction D1 shown in FIG. 1), and a thickness TK1 of the first portion 20A is greater than a thickness TK2 of the second portion 20B. The gate structure 30 is disposed on the gate oxide layer 20 and the isolation structure 14. In the high voltage semiconductor device 101, the relatively thicker first portion 20A of the gate oxide layer 20 may be used to improve the reliability of the high voltage semiconductor device 101, and the relatively thinning second portion 20B located at the two opposite sides of the first portion 20A in the first direction D1 respectively may be used to improve the electrical performance of the high voltage semiconductor device 101, but not limited thereto.

Specifically, in some embodiments, the semiconductor substrate 10 may include a silicon substrate, an epitaxial silicon substrate, a silicon germanium substrate, a silicon carbide substrate, a silicon-on-insulator (SOI) substrate, or a substrate made of other suitable semiconductor materials. The isolation structure 14 may include a single layer or multiple layers of insulation materials, such as oxide insulation material (silicon oxide, for example), or other suitable insulation materials, and the isolation structure 14 may be regarded as a shallow trench isolation (STI) structure, but not limited thereto. In addition, the two portions marked with 14 in FIG. 1 may be different portions of the isolation structure 14 described above and may be connected with each other or separated from each other. In other words, at least a part of the isolation structure 14 may be disposed at two opposite sides of the gate oxide layer 20 in the first direction D1, but not limited thereto. The gate oxide layer 20 may be sandwiched between different portions of the isolation structure 14 in the first direction D1. Therefore, the second portion 20B of the gate oxide layer 20 may be located between the first portion 20A of the gate oxide layer 20 and the isolation structure 14 in the first direction D1, an end of the second portion 20B of the gate oxide layer 20 in the first direction D1 may be directly connected with the first portion 20A, and another end of the second portion 20B of the gate oxide layer 20 in the first direction D1 may be directly connected with the isolation structure 14, but not limited thereto.

In some embodiments, a second direction D2 orthogonal to the first direction D1 described above may be regarded as a thickness direction of the semiconductor substrate 10. The semiconductor substrate 10 may have a top surface 10TS and a bottom surface 10BS opposite to the top surface 10TS in the second direction D2, and the gate oxide layer 20 and the gate structure 30 may be disposed on a side of the top surface 10TS, but not limited thereto. Horizontal directions (such as the first direction D1 and the third direction D3 shown in FIG. 1) substantially orthogonal to the second direction D2 may be substantially parallel with the top surface 10TS of the semiconductor substrate 10 and/or the bottom surface 10BS of the semiconductor substrate 10, but not limited thereto. Additionally, in this description, a distance between the bottom surface 10BS of the semiconductor substrate 10 and a relatively higher location and/or a relatively higher part in the vertical direction (such as the second direction D2) is greater than a distance between the bottom surface 10BS of the semiconductor substrate 10 and a relatively lower location and/or a relatively lower part in the second direction D2. The bottom or a lower portion of each component may be closer to the bottom surface 10BS of the semiconductor substrate 10 in the second direction D2 than the top or upper portion of this component. Another component disposed above a specific component may be regarded as being relatively far from the bottom surface 10BS of the semiconductor substrate 10 in the second direction D2, and another component disposed under a specific component may be regarded as being relatively closer to the bottom surface 10BS of the semiconductor substrate 10 in the second direction D2.

In some embodiments, the high voltage semiconductor device 101 may further include two drift regions 16 disposed in the semiconductor substrate 10 and located at two opposite sides of the channel region CH in the first direction D1 respectively, and at least a part of the isolation structure 14 may be disposed in the two drift regions 16, but not limited thereto. In addition, the second portion 20B of the gate oxide layer 20 may be disposed on the two drift regions 16 in the second direction D2, and the first portion 20A of the gate oxide layer 20 may be partly disposed on the channel region CH and partly disposed on the two drift regions 16 in the second direction D2, but not limited thereto. In some embodiments, a length of the first portion 20A of the gate oxide layer 20 in the first direction D1 may be greater than the minimum length of the channel region CH in the first direction D1 and the minimum distance between the two drift regions 16 in the first direction D1. Therefore, two opposite ends of the first portion 20A of the gate oxide layer 20 in the first direction D1 may be disposed on the two drift regions 16 respectively, but not limited thereto. In some embodiments, the drift regions 16 may include doped regions formed by performing a doping process (such as an implantation process) to the semiconductor substrate 10. The semiconductor substrate 10 may have a first conductivity type or include a first conductivity type region (such as a well region 12 shown in FIG. 1, but not limited thereto), the drift regions 16 may have a second conductivity type, and the second conductivity type may be complementary to the first conductivity type. For example, in this embodiment, the first conductivity type may be p-type, and the second conductivity type may be n-type, but not limited thereto. In other words, the semiconductor substrate 10 may be a p-type semiconductor substrate or a semiconductor substrate including a p-type well (such as the well region 12), and the drift regions 16 may be n-type doped regions, but not limited thereto.

In some embodiments, the gate oxide layer 20 may include silicon oxide or other suitable oxide dielectric materials, and the first portion 20A and the second portion 20B of the gate oxide layer 20 may have the same material composition and may be directly connected with each other, but not limited thereto. In some embodiments, the first portion 20A and the second portion 20B of the gate oxide layer 20 may be formed with different oxide dielectric materials respectively according to some design considerations. In addition, the thickness TK1 of the first portion 20A of the gate oxide layer 20 may be regarded as a length of the first portion 20A in the second direction D2, and the thickness TK2 of the second portion 20B of the gate oxide layer 20 may be regarded as a length of the second portion 20B in the second direction D2. In some embodiments, the first portion 20A may have a top surface TS1 and a bottom surface BS1 opposite to the top surface TS1 in the second direction D2, and the second portion 20B may have a top surface TS2 and a bottom surface BS2 opposite to the top surface TS2 in the second direction D2. The bottom surface BS1 of the first portion 20A may be lower than the bottom surface BS2 of the second portion 20B in the second direction D2, and the top surface TS1 of the first portion 20A may be higher than the top surface TS2 of the second portion 20B in the second direction D2, but not limited thereto.

In some embodiments, the high voltage semiconductor device 101 may further include a spacer 32 and two source/drain regions 34. The spacer 32 may be disposed on the sidewall of the gate structure 30 and located on the isolation structure 14 in the second direction D2, and the two source/drain regions 34 may be disposed in the two drift regions 16 respectively and located at the relatively outer side of the high voltage semiconductor device 101. The spacer 32 may include a single layer or multiple layers of dielectric materials, such as silicon oxide, silicon nitride, silicon oxynitride, or other suitable dielectric materials, and the source/drain regions 34 may include doped regions formed in the semiconductor substrate 10 by a doping process (such as an implantation process). In some embodiments, the conductivity type of the source/drain region 34 may be identical to the conductivity type of the drift region 16, but the doping concentration of the source/drain region 34 may be higher than the doping concentration of the drift region 16. For example, the source/drain region 34 may be an n-type heavily doped region, but not limited thereto.

In addition, the gate structure 30 may include a gate dielectric layer (not shown) and a gate material layer (not shown) disposed on the gate dielectric layer. The gate dielectric layer may include a high dielectric constant (high-k) dielectric material or other suitable dielectric materials, and the gate material layer may include a non-metallic electrically conductive material (such as doped polysilicon) or a metallic electrically conductive material, such as a metal gate structure formed with a work function layer and a low electrical resistivity layer stacked with each other, but not limited thereto. The high-k dielectric material described above may include hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials. The work function layer described above may include titanium nitride (TiN), titanium carbide (TiC), tantalum nitride (TaN), tantalum carbide (TaC), tungsten carbide (WC), titanium trialuminide ($TiAl_3$), aluminum titanium nitride (TiAlN), or other suitable electrically conductive work function materials. The low electrical resistivity layer described above may include tungsten, aluminum, copper, titanium aluminide, titanium, or other suitable low electrical resistivity materials.

In some embodiments, the gate structure 30 may cover the first portion 20A and the second portion 20B of the gate oxide layer 20 in the second direction D2, and in the second direction D2, the gate structure 30 may cover a part of the isolation structure 14 located at the two opposite sides of the gate oxide layer 20 in the first direction D1. Therefore, the gate structure 30 may overlap an interface S between the isolation structure 14 and the second portion 20B of the gate oxide layer 20 in the second direction D2. Additionally, in the high voltage semiconductor device 101, a bottom surface 14BS of the isolation structure 14 may be lower than the bottom surface BS1 of the first portion 20A of the gate oxide layer 20 and the bottom surface BS2 of the second portion 20B in the second direction D2, and a bottom surface 16BS of the drift regions 16 may be lower than the bottom surface 14BS of the isolation structure 14 in the second direction D2. Therefore, at least a part of the isolation structure 14 disposed in the drift regions 16 may be used to adjust the current path in the drift regions 16 for further improving the voltage endurance of the high voltage semiconductor device 101, and the high voltage semiconductor device 101 including the drift regions 16 and the isolation structure 14 may be regarded as a field drift MOS (FDMOS) transistor, but not limited thereto.

Generally, a relatively thicker gate oxide layer with a uniform thickness may be used to improve the reliability of the high voltage semiconductor device and have negative influence on the electrical performance of the high voltage semiconductor device at the same time. However, in the present invention, the gate oxide layer 20 has the first portion 20A and the second portion 20B with different thicknesses, and the relatively thicker first portion 20A may be used to improve the reliability of the high voltage semiconductor device 101. For instance, the negative-bias temperature instability (NBTI) of the high voltage semiconductor device 101 may be improved by the first portion 20A, but not limited thereto. Additionally, the relatively thinner second portion 20B located on the drift regions 16 may be used to lower the resistance at the drift regions 16 for improving the electrical performance of the high voltage semiconductor device 101. For example, because the second portion 20B is relatively thinner and the bottom surface BS2 of the second portion 20B is higher than the bottom surface BS1 of the first portion 20A in the second direction D2, a region below the bottom surface BS2 of the second portion 20B (such as a region of the drift region 16 located between the isolation structure 14 and the first portion 20A in the first direction and located beneath the second portion 20B in the second direction D2) may be used for accumulating drift current additionally, and the electrical performance of the high voltage semiconductor device 101 may be improved accordingly.

In some embodiments, a top surface 14TS of the isolation structure 14 and the top surface TS2 of the second portion 20B of the gate oxide layer 20 may be substantially coplanar for reducing negative influence of the height difference between the isolation structure 14 and the second portion 20B of the gate oxide layer 20 (such as the negative influence on the gate structure 30 and/or the process of forming the gate structure 30), but not limited thereto. In some embodiments, the top surface TS2 of the second portion 20B of the gate oxide layer 20 may be slightly higher than the top surface 14TS of the isolation structure 14 in the second direction D2 or slightly lower than the top surface 14TS of the isolation structure 14 in the second direction D2. In addition, the top surface TS1, the top surface TS2, the top surface 10TS, and the top surface 14TS described above may be the topmost surfaces of the first portion 20A, the second portion 20B, the semiconductor substrate 10, and the isolation structure 14 in the second direction D2, respectively, and the bottom surface BS1, the bottom surface BS2, the bottom surface 10B, the bottom surface 14BS, and the bottom surface 16BS described above may be the bottommost surfaces of the first portion 20A, the second portion 20B, the semiconductor substrate 10, the isolation structure 14, and the drift region 16 in the second direction D2, respectively, but not limited thereto.

Figure 2:
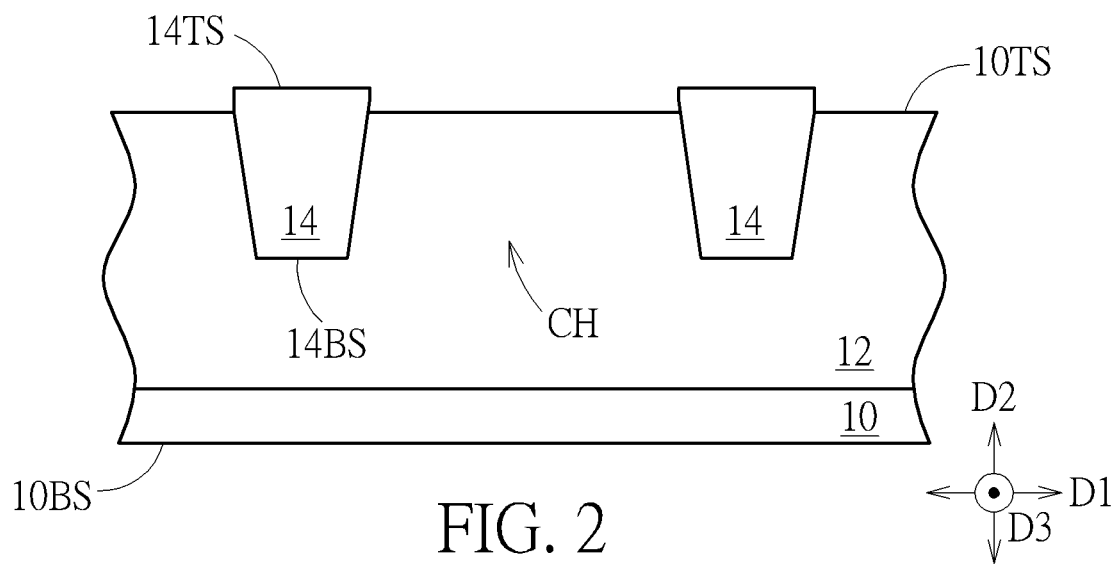
Figure 3:
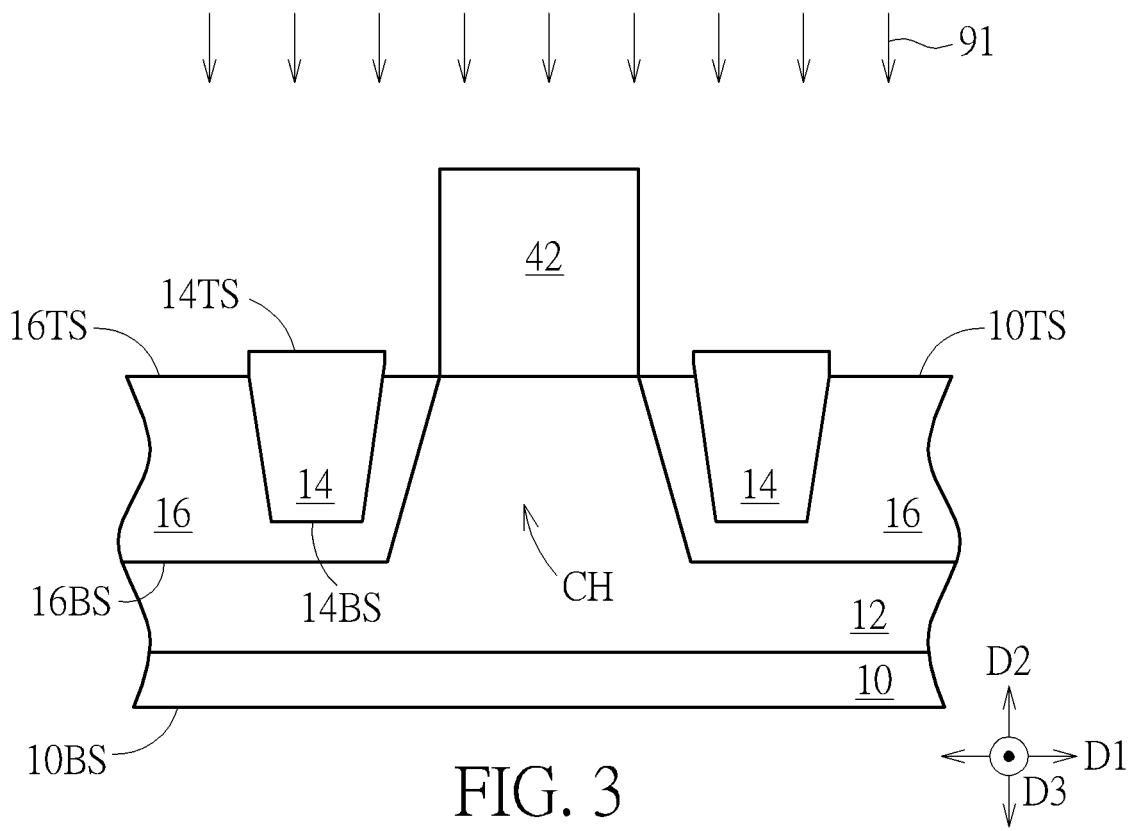
Figure 4:
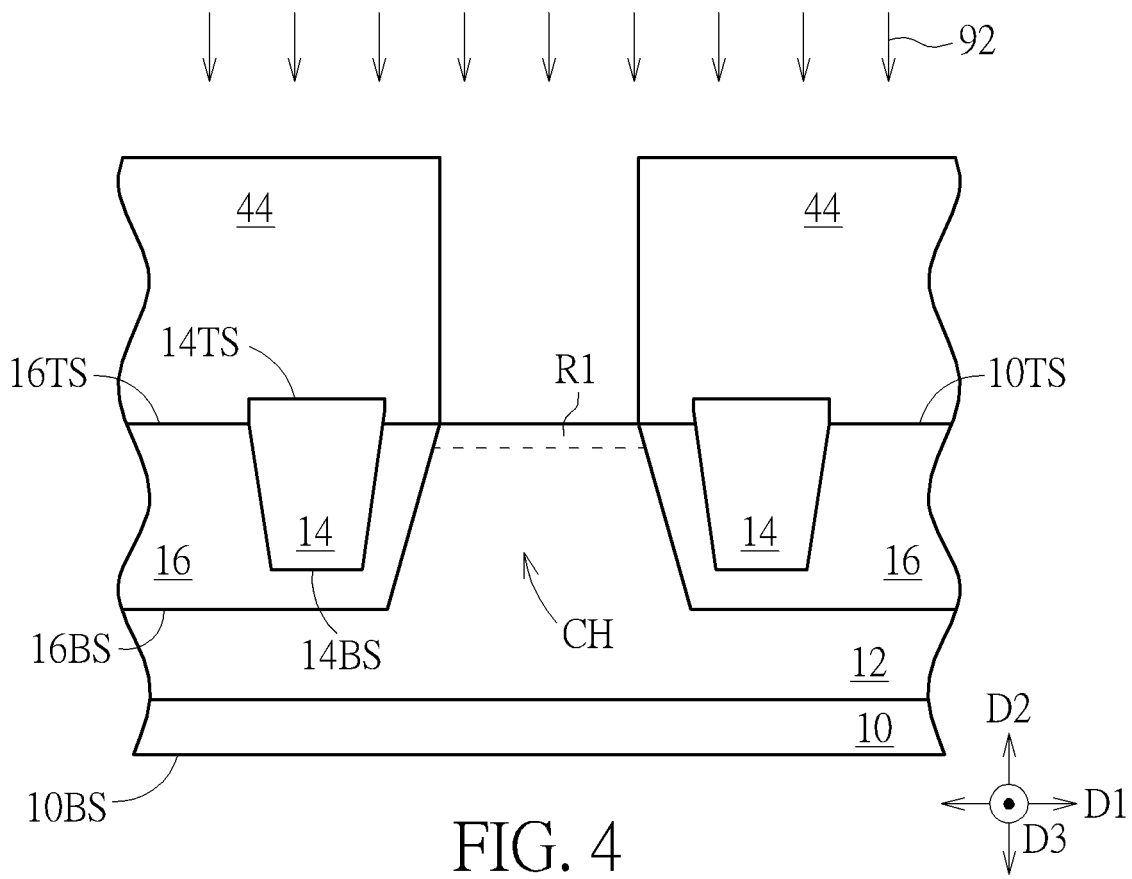
Figure 5:
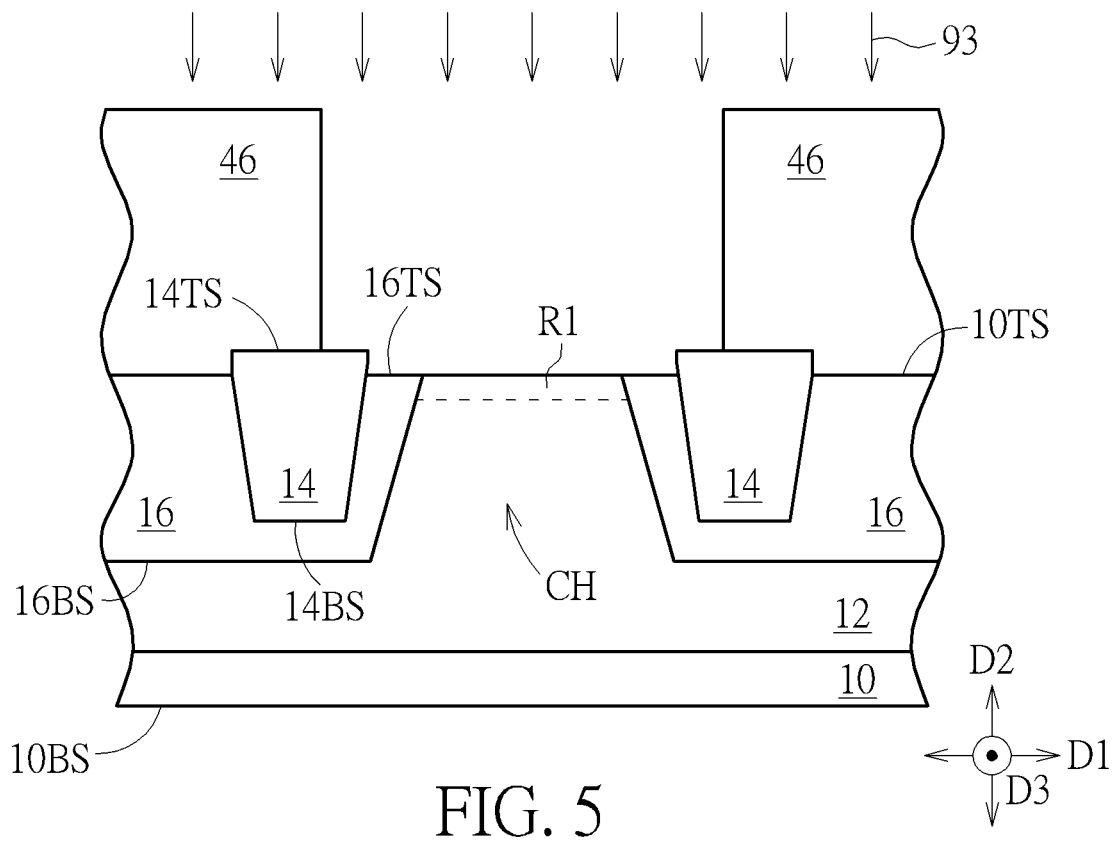
Figure 6:
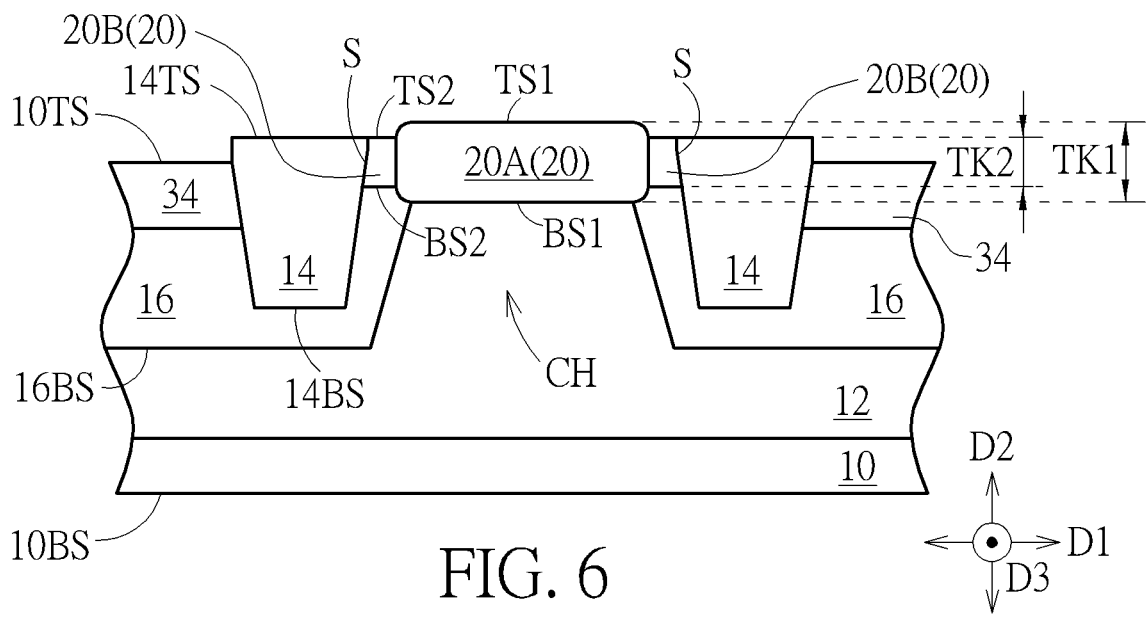

Please refer to FIGS. 1-6. FIGS. 2-6 are schematic drawings illustrating a manufacturing method of a high voltage semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 1 may be regarded as a schematic drawing in a step subsequent to FIG. 6. As shown in FIG. 1, the manufacturing method of the high voltage semiconductor device 101 in this embodiment may include the following steps. Firstly, the semiconductor 10 is provided. The isolation structure 14 is formed, and at least a part of the isolation structure 14 is formed in the semiconductor substrate 10 and surrounds the channel region CH in the semiconductor substrate 10. The gate oxide layer 20 is formed on the semiconductor substrate 10, and the gate oxide layer 20 includes the first portion 20A and the second portion 20B. The second portion 20B is disposed at two opposite sides of the first portion 20A in a horizontal direction (such as the first direction D1), and the thickness TK1 of the first portion 20A is greater than the thickness TK2 of the second portion 20B. Subsequently, the gate structure 30 is formed on the gate oxide layer 20 and the isolation structure 14.

Specifically, the manufacturing method in this embodiment may include but is not limited to the following steps. As shown in FIG. 2, the isolation structure 14 may be formed, and at least a part of the isolation structure 14 may be formed in the semiconductor substrate 10 for defining the channel region CH in the semiconductor substrate 10. In some embodiments, a trench may be formed in the semiconductor substrate 10, the trench may be filled with a single layer or multiple layers of insulation materials for forming the isolation structure 14, and the top surface 14TS of the isolation structure 14 may be slightly higher than the top surface 10TS of the semiconductor substrate 10 in the second direction D2, but not limited thereto. Additionally, in some embodiments, a doping process may be performed to the semiconductor substrate 10 before the step of forming the isolation structure 14 for forming the well region 12 in the semiconductor substrate 12, and the bottom surface of the well region 12 may be lower than the bottom surface 14BS of the isolation structure 14 in the second direction D2, but not limited thereto.

Subsequently, as shown in FIG. 3, a first doping process 91 may be performed for forming the above-mentioned two drift regions 16 in the semiconductor substrate 10. In some embodiments, a first patterned mask layer 42 may be formed on the semiconductor substrate 10 before the first doping process 91, and the first patterned mask layer 42 may cover a part of the channel region CH in the first doping process 91 for forming the two drift regions 16 in the channel region CH partially. Therefore, after the first doping process 91, the two drift regions 16 may be located at two opposite sides of the channel region CH in the first direction D1, respectively, and at least a part of the isolation structure 14 may be located in the two drift regions 16. In some embodiments, the first patterned mask layer 42 may include a photopatternable material, such as photoresist, an organic dielectric material, an anti-reflection material, or other suitable mask materials, and the first patterned mask layer 42 may be removed after the first doping process 91, but not limited thereto.

As shown in FIG. 3 and FIG. 4, after the first doping process 91 and before the step of forming the gate oxide layer described above, a second doping process 92 may be performed to the channel region CH for forming a first treated region R1 in the semiconductor substrate 10. The first treated region R1 may include a plurality of first impurities, and the first treated region R1 may be formed above the channel region CH in the second direction D2. In some embodiments, a second patterned mask layer 44 may be formed on the semiconductor substrate 10 before the second doping process 92, and the second patterned mask layer 44 may cover an area outside the channel region CH (such as the drift regions 16, a top surface 16TS of the drift regions, and the isolation structure 14) in the second doping process 92 for avoiding the negative influence of the second doping process 92 on the isolation structure 14 and/or the drift regions 16. The material composition of the second patterned mask layer 44 may be similar to the material composition of the first patterned mask layer 42 described above, and the second patterned mask layer 44 may be removed after the second doping process 92, but not limited thereto.

In some embodiments, dopants used in the second doping process 92 may include at least one of carbon, germanium, fluorine, or arsenic, and the first impurities in the first treated region R1 may include at least one of carbon, germanium, fluorine, or arsenic accordingly, but not limited thereto. In some embodiments, other suitable dopants may be used in the second doping process 92 and/or the first impurities in the first treated region R1 may include other suitable elements and/or compounds according to other design considerations for modifying the rate of oxidation (or be regarded as the oxidation rate) of the first treated region R1 in the subsequent oxidation process. In some embodiments, the implantation dose of the second doping process 92 may range from 1 E+15 ion/cm$^2$ to 5 E+15 ion/cm$^2$, the implantation energy of the second doping process 92 may range from 20 KeV to 50 KeV, and the depth of the first treated region R1 in the second direction D2 may range from 200 angstroms to 500 angstroms, but the present invention is not limited to this and the process parameters of the second doping process 92 may be further modified according to other design considerations (such as the thickness specification of the gate oxide layer) for forming the first treated region R1 with the required depth and/or the required concentration of the first impurities.

Subsequently, as shown in FIG. 5 and FIG. 6, an oxidation process 93 may be carried out for forming the gate oxide layer 20 described above. In some embodiments, a third patterned mask layer 46 may be formed on the semiconductor substrate 10 before the oxidation process 93, and the third patterned mask layer 46 may cover a part of the isolation structure 14 and a part of the drift region 16 in the oxidation process 93 for exposing the first treated region R1 and the drift region 16 located between the first treated region R1 and the isolation structure 14 in the oxidation process 93. The material composition of the third patterned mask layer 46 may be similar to the material composition of the first patterned mask layer described above, and the third patterned mask layer 46 may be removed after the oxidation process 93, but not limited thereto. In some embodiments, the oxidation process 93 may include a thermal oxidation process or other suitable oxidation approaches for oxidizing the exposed semiconductor substrate 10 (such as the first treated region R1 and the drift region 16 located between the first treated region R1 and the isolation structure 14) to be the gate oxide layer 20.

It is worth noting that, by the material selection of the first impurities in the first treated region R1, a rate of oxidation of the first treated region R1 in the oxidation process 93 may be higher than a rate of oxidation of the two drift regions 16 in the oxidation process 93 for forming the gate oxide layer 20 including the first portion 20A and the second portion 20B with different thicknesses. In some embodiments, the first portion 20A, which is relatively thicker in the gate oxide layer 20, may be mainly formed from the first treated region R1 oxidized by the oxidation process 93. Therefore, the first portion 20A may be formed from the first treated region R1 and expand to be partly located in the drift regions 16, and the second portion 20B, which is relatively thinner in the gate oxide layer 20, may be mainly formed from the exposed drift regions 16 oxidized by the oxidation process 93, but not limited thereto. By the manufacturing method in this embodiment, the gate oxide layer 20 including portions with different thicknesses may be formed and the thermal budget of the processes may be reduced and/or controlled, and that is beneficial for the total manufacturing processes of the high voltage semiconductor device. In addition, the method of forming the gate oxide layer 20 in this embodiment is not limited to the approach described above and other suitable approaches may also be used to form the gate oxide layer 20 including portions with different thicknesses according to other design considerations. Subsequently, as shown in FIG. 6 and FIG. 1, after the step of forming the gate oxide layer 20, the gate structure 30, the spacer 32, and the source/drain regions 34 may be formed for forming the high voltage semiconductor device 101 shown in FIG. 1.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 7:
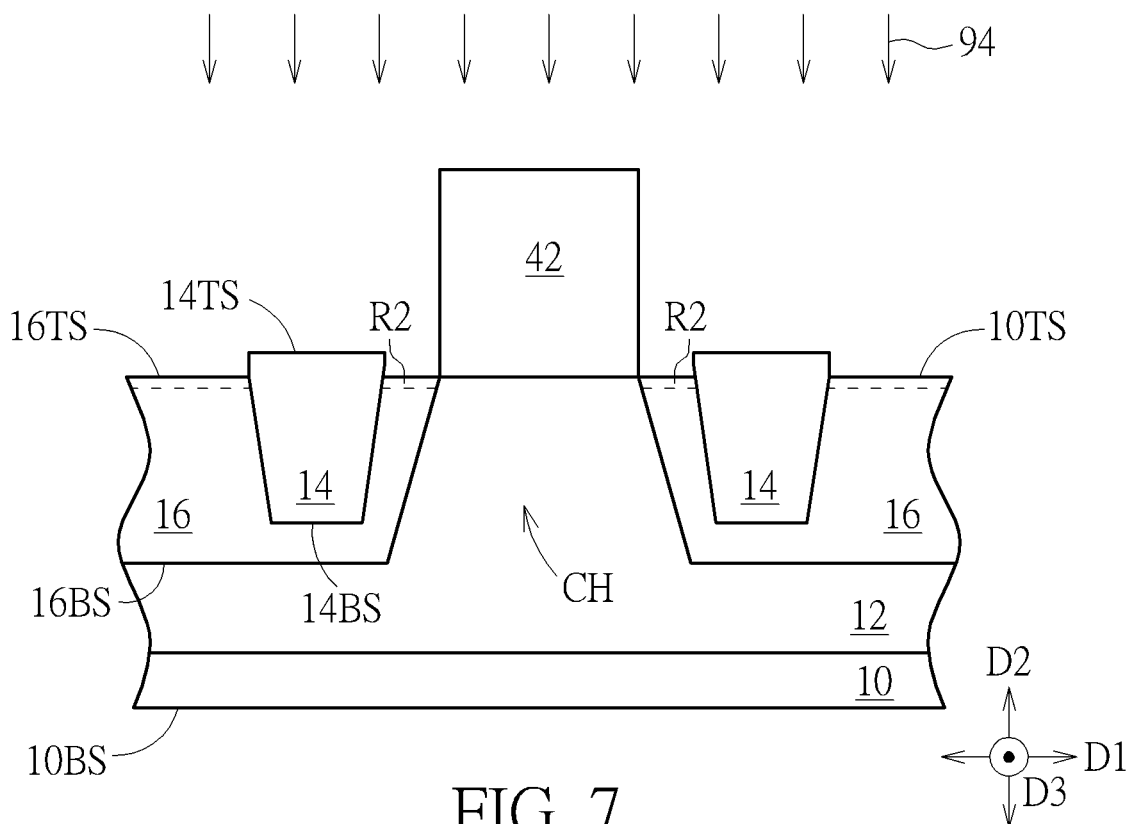
Figure 8:
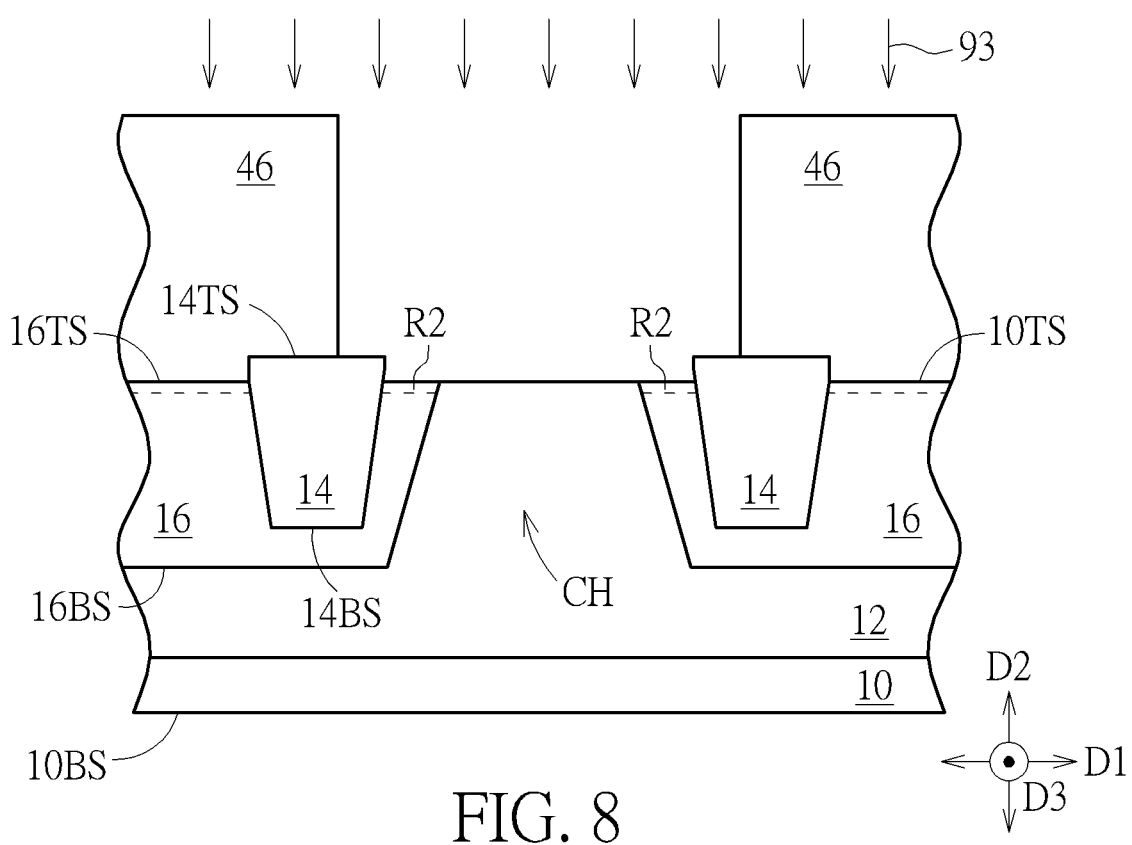

Please refer to FIG. 3, FIG. 6, FIG. 7, and FIG. 8. FIG. 7 and FIG. 8 are schematic drawings illustrating a manufacturing method of a high voltage semiconductor device according to a second embodiment of the present invention, wherein FIG. 8 is a schematic drawing in a step subsequent to FIG. 7, FIG. 7 may be regarded as a schematic drawing in a step subsequent to FIG. 3, and FIG. 6 may be regarded as a schematic drawing in a step subsequent to FIG. 8. As shown in FIG. 3 and FIG. 7, in some embodiments, before the step of forming the gate oxide layer described above and after the first doping process 91, a third doping process 94 may be performed to the semiconductor substrate 10 for forming a second treated region R2 in the semiconductor substrate 10, the second treated region R2 may include a plurality of second impurities, and the second impurities are different from the first impurities in the embodiment described above. In some embodiments, the first patterned mask layer 42 described above may cover the channel region CH in the third doping process 94, and the second treated region R2 may be formed above the two drift regions 16 by the third doping process 94 accordingly. In other words, the first doping process 91 and the third doping process 94 may use the same patterned mask layer for process simplification, but not limited thereto. In some embodiment, the patterned mask layer used in the third doping process 94 may be different from the first patterned mask layer 42 used in the first doping process 91 according to some design consideration for further covering the area where the gate oxide layer is not going to be formed in the third doping process 94. In addition, the first patterned mask layer 42 and/or other patterned mask layer used in the third doping process 94 may be removed after the third doping process 94.

In some embodiments, dopants used in the third doping process 94 may include nitrogen or other materials capable of lowering the rate of oxidation of the semiconductor substrate 10, and the second impurities in the second treated region R2 may include nitrogen or other materials capable of lowering the rate of oxidation of the semiconductor substrate 10, but not limited thereto. In some embodiments, other suitable dopants may be used in the third doping process 94 and/or the second impurities in the second treated region R2 may include other suitable elements and/or compounds according to other design considerations for modifying the rate of oxidation of the second treated region R2 in the subsequent oxidation process. In some embodiments, the implantation dose of the third doping process 94 may range from 1 E+15 ion/cm$^2$ to 5 E+15 ion/cm$^2$, the implantation energy of the third doping process 94 may range from 2 KeV to 8 KeV, and the depth of the second treated region R2 in the second direction D2 may be less than or equal to 100 angstroms, but the present invention is not limited to this and the process parameters of the third doping process 94 may be further modified according to other design considerations for forming the second treated region R2 with the required depth and/or the required concentration of the second impurities.

Subsequently, as shown in FIG. 8 and FIG. 6, the oxidation process 93 may be carried out for forming the gate oxide layer 20 described above. In some embodiments, the third patterned mask layer 46 may cover a part of the isolation structure 14 and a part of the drift region 16 in the oxidation process 93 for exposing the channel region CH and the second treated region R2 sandwiched between different portions of the isolation structure 14 in the first direction D1. In addition, by the material selection of the second impurities in the second treated region R2, a rate of oxidation of the second treated region R2 in the oxidation process 93 may be lower than a rate of oxidation of the channel region CH in the oxidation process 93 for forming the gate oxide layer 20 including the first portion 20A and the second portion 20B with different thicknesses. In some embodiments, the first portion 20A, which is relatively thicker in the gate oxide layer 20, may be mainly formed from the channel region CH oxidized by the oxidation process 93, and the first portion 20A may be formed from the channel region CH and expand to be partly located in the drift regions 16. The second portion 20B, which is relatively thinner in the gate oxide layer 20, may be mainly formed from the exposed second treated region R2 oxidized by the oxidation process 93, but not limited thereto. By the manufacturing method in this embodiment, the gate oxide layer 20 including portions with different thicknesses may be formed and the thermal budget of the processes may be reduced and/or controlled also, and that is beneficial for the total manufacturing processes of the high voltage semiconductor device.

Figure 9:
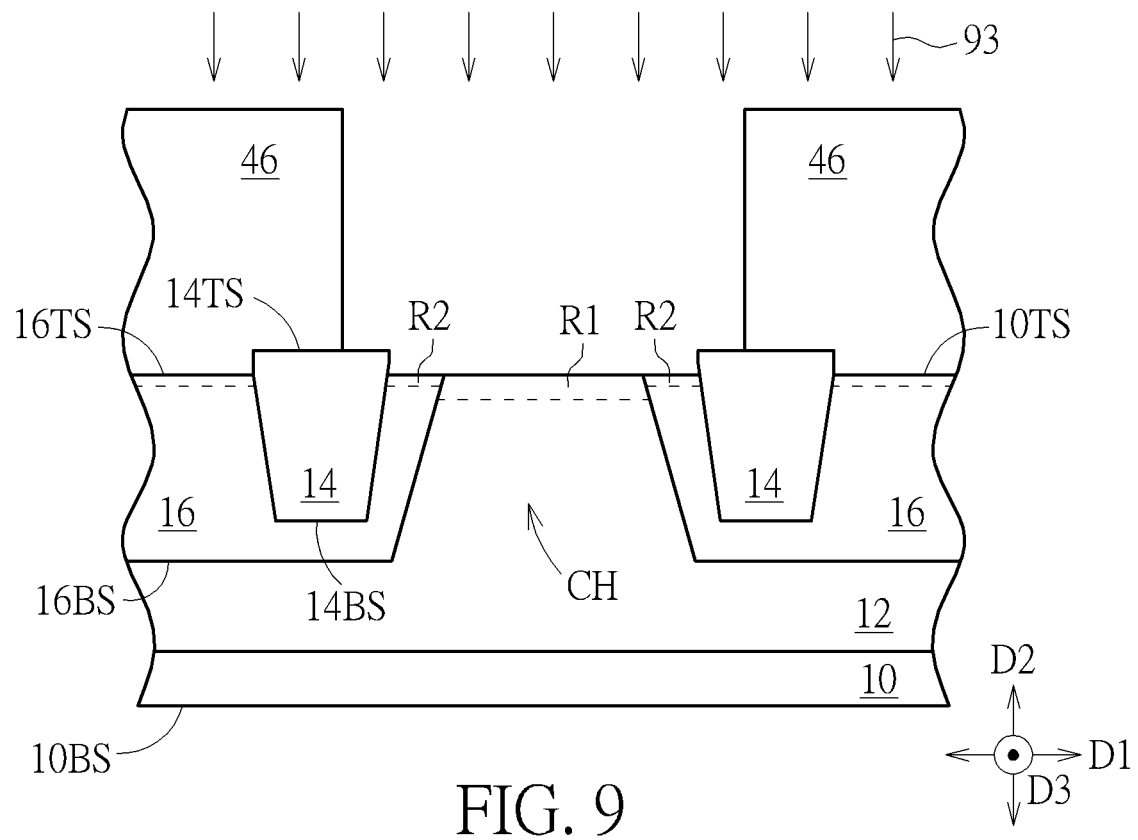
Figure 10:
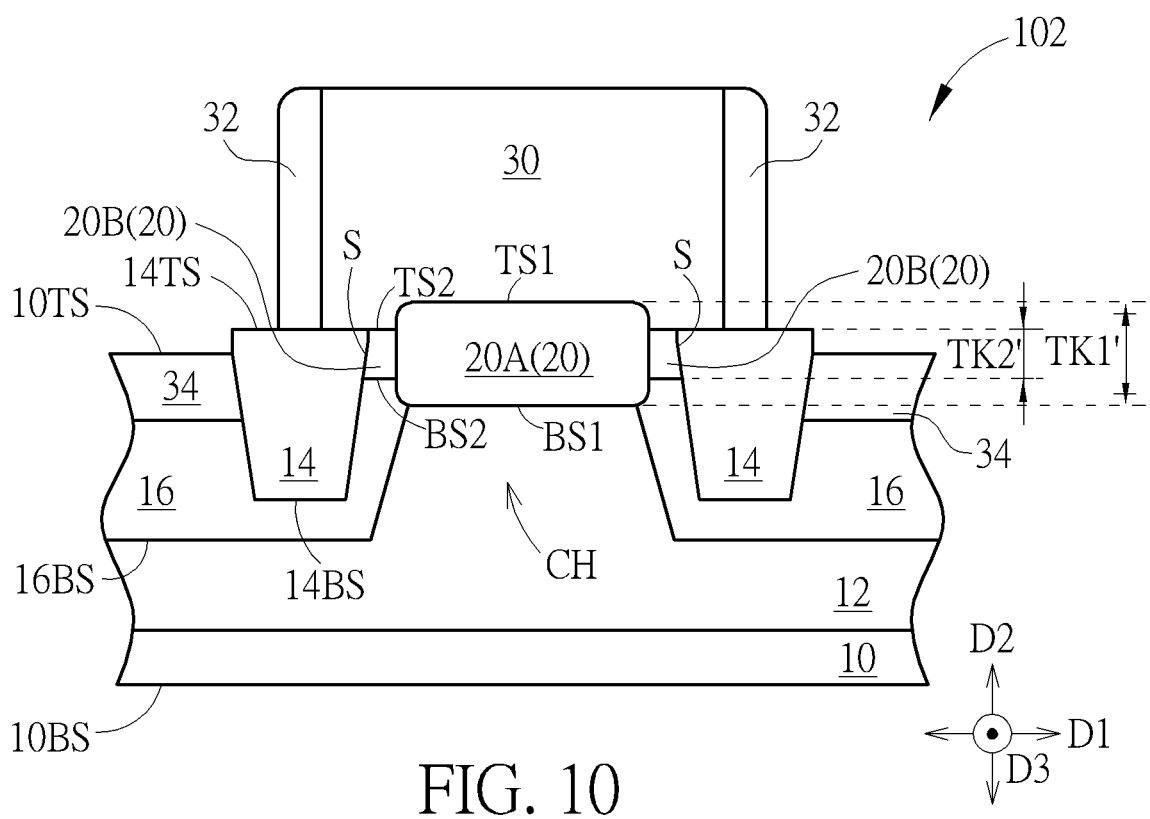

Please refer to FIG. 9 and FIG. 10. FIG. 9 and FIG. 10 are schematic drawings illustrating a manufacturing method of a high voltage semiconductor device 102 according to a third embodiment of the present invention, wherein FIG. 10 is a schematic drawing in a step subsequent to FIG. 9. As shown in FIG. 9 and FIG. 10, in some embodiments, the first treated region R1 and the second treated region R2 may be formed before the oxidation process 93 configured for forming the gate oxide layer 20, and the depth of the second treated region R2 in the second direction D2 may be less than the depth of the first treated region R1 in the second direction D2, but not limited thereto. In some embodiments, the first treated region R1 may be formed by the second doping process 92 shown in FIG. 4 described above, and the second treated region R2 may be formed by the third doping process 94 shown in FIG. 7 described above. The third doping process 94 may be carried out before the second doping process 92, and the first patterned mask layer 42 may be shared by and used in the third doping process 94 and the first doping process 91 shown in FIG. 3 described above for process simplification, but not limited thereto.

In addition, the rate of oxidation of the first treated region R1 in the oxidation process 93 may be higher than the rate of oxidation of the second treated region R2 in the oxidation process 93 for forming the gate oxide layer 20 including the first portion 20A and the second portion 20B with different thicknesses, and the thickness TK1' of the first portion 20A of the gate oxide layer 20 may be further increased (such as being thicker than the first portion 20A in the first embodiment described above) and/or the thickness TK2' of the second portion 20B of the gate oxide layer 20 may be relatively reduced. Therefore, in the high voltage semiconductor device 102 of this embodiment, a ratio of the thickness TK1' of the first portion 20A to the thickness TK2' of the second portion 20B in the gate oxide layer 20 may be greater than a ratio of the thickness TK1 of the first portion 20A to the thickness TK2 of the second portion 20B in the gate oxide layer 20 shown in FIG. 1, but not limited thereto.

To summarize the above descriptions, according to the high voltage semiconductor device and the manufacturing method thereof in the present invention, the gate oxide layer may include portions with different thicknesses, the relatively thicker first portion of the gate oxide layer may be used to improve the reliability of the high voltage semiconductor device, and the relatively thinner second portion of the gate oxide layer may be used to enhance the electrical performance of the high voltage semiconductor device. Therefore, the purposes of improving the reliability and enhancing the electrical performance may be both achieved. Additionally, in the manufacturing method of the high voltage semiconductor device, the rate of oxidation of different areas on the semiconductor substrate may be adjusted by the doping processes for forming the gate oxide layer including portions with different thicknesses in the oxidation process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a high voltage semiconductor device, comprising:
   providing a semiconductor substrate;
   forming an isolation structure, wherein at least a part of the isolation structure is formed in the semiconductor substrate and surrounds a channel region in the semiconductor substrate;
   forming a gate oxide layer on the semiconductor substrate, wherein the gate oxide layer comprises:
      a first portion; and
      a second portion disposed at two opposite sides of the first portion in a horizontal direction, wherein a thickness of the first portion is greater than a thickness of the second portion;
   forming a gate structure on the gate oxide layer and the isolation structure;
   performing a first doping process for forming two drift regions in the semiconductor substrate, wherein the two drift regions are located at two opposite sides of the channel region in the horizontal direction respectively, and at least a part of the isolation structure is located in the two drift regions; and
   performing a third doping process to the semiconductor substrate before the step of forming the gate oxide layer and after the first doping process, wherein a second treated region comprising second impurities is formed above the two drift regions by the third doping process.

2. The manufacturing method of the high voltage semiconductor device according to claim 1, further comprising:
   performing a second doping process to the channel region before the step of forming the gate oxide layer and after the first doping process, wherein a first treated region comprising first impurities is formed above the channel region by the second doping process.

3. The manufacturing method of the high voltage semiconductor device according to claim 2, wherein the gate oxide layer is formed by an oxidation process, and a rate of oxidation of the first treated region in the oxidation process is higher than a rate of oxidation of the two drift regions in the oxidation process.

4. The manufacturing method of the high voltage semiconductor device according to claim 2, wherein the first impurities comprise carbon, germanium, fluorine, or arsenic.

5. The manufacturing method of the high voltage semiconductor device according to claim 1, wherein the gate oxide layer is formed by an oxidation process, and a rate of oxidation of the second treated region in the oxidation process is lower than a rate of oxidation of the channel region in the oxidation process.

6. The manufacturing method of the high voltage semiconductor device according to claim 1, wherein the second impurities comprise nitrogen.

7. The manufacturing method of the high voltage semiconductor device according to claim 1, wherein a patterned mask layer is formed on the semiconductor substrate before the first doping process, and the patterned mask layer covers the channel region in the first doping process and the third doping process.

8. The manufacturing method of the high voltage semiconductor device according to claim 1, wherein a bottom surface of the first portion is lower than a bottom surface of the second portion in a vertical direction perpendicular to the horizontal direction.

9. The manufacturing method of the high voltage semiconductor device according to claim 1, wherein a top surface of the first portion is higher than a top surface of the second portion in a vertical direction perpendicular to the horizontal direction.

* * * * *